United States Patent [19]

Yemane-Berhane et al.

[11] Patent Number: 5,406,905
[45] Date of Patent: Apr. 18, 1995

[54] CAST DOPANT FOR CRYSTAL GROWING

[75] Inventors: Mengistu Yemane-Berhane, Beaverton, Oreg.; Bruce L. Colburn, Vancouver, Wash.

[73] Assignee: Simco/Ramic Corporation, Medford, Oreg.

[21] Appl. No.: 69,123

[22] Filed: May 28, 1993

[51] Int. Cl.6 .......................... C30B 15/04; C30B 15/32
[52] U.S. Cl. .......................................... 117/19; 117/21; 117/911; 117/932
[58] Field of Search ............ 156/605, 617.1, DIG. 65, 156/DIG. 98; 117/19, 21, 932, 911

[56] References Cited

U.S. PATENT DOCUMENTS 5,007,980 4/1991 Swiggard ..................... 156/616.1

FOREIGN PATENT DOCUMENTS

| | | | |
|---|---|---|---|
| 2751388 | 5/1979 | Germany | 156/605 |
| 60-171291 | 9/1985 | Japan | |
| 62-151388 | 7/1987 | Japan | |
| 63-123893 | 5/1988 | Japan | 156/605 |
| 63-151696 | 6/1988 | Japan | 156/605 |

*Primary Examiner*—Robert Kunemund
*Attorney, Agent, or Firm*—Stoel Rives Boley Jones and Grey

[57] ABSTRACT

A dopant (76), such as antimony, is cast around a seed crystal (10) to form a seed-dopant assembly (14) that facilitates doping of a molten semiconductor (36), such as silicon, in a crystal-growing furnace (34). To grow a doped ingot, the seed-dopant assembly is held in a relatively cool part of the furnace while the semiconductor is melted. When the semiconductor melt is ready for doping, the seed-dopant assembly is lowered to a position just above the melt. Heat transferred to the seed dopant assembly from the melt causes the dopant to drop off the seed into the molten semiconductor without splashing and without immersing the seed.

18 Claims, 2 Drawing Sheets

CAST DOPANT FOR CRYSTAL GROWING

TECHNICAL FIELD

This invention relates to the growth of doped semiconductor crystals and, in particular, to the doping of molten semiconductors with high vapor pressure dopants.

BACKGROUND OF THE INVENTION

Semiconductor wafers typically include a controlled concentration of a dopant to produce desired electrical characteristics. Such doped wafers are typically produced by adding a calculated amount of dopant to a polycrystalline semiconductor and melting the dopant and semiconductor together in a crucible in a Czochralski-type crystal-growing furnace. The polycrystalline silicon and the dopant mix together in a liquid state to produce a molten mixture having a desired dopant concentration that is proportional to the concentration desired in the finished wafer. A single-crystal ingot is pulled from the molten mix.

Some dopants, such as antimony, have a vapor pressure sufficiently high to cause the concentration of dopant in the melt to change significantly as the semiconductor and dopant are melting together in the furnace. The change in dopant concentration cannot be accurately predicted, so the ability to accurately produce crystals having desired electrical properties is limited. To overcome this problem, several techniques have been developed for adding high vapor pressure dopants to the semiconductor after it is melted. Such techniques are difficult to perform, however, because the molten semiconductor (the "melt") must be maintained in an inert atmosphere in the crystal-growing furnace.

A Czochralski crystal-growing furnace typically consists of two separately sealable vacuum-tight sections: a pull chamber, which has space for enclosing the ingot as it is grown and includes a seed cable or shaft for lowering and raising a seed crystal, and a furnace tank, which contains a crucible containing the melt.

A common method of adding a pelletized dopant in a B—B form to the melt entails using a special apparatus or delivery device suspended from the seed cable. The special apparatus is lowered to a fixed point above the melt and the pellets are released to the melt. After the special apparatus is removed from the seed cable and a seed crystal is attached, the seed crystal is lowered to the melt, and crystal pulling can begin.

This method has several disadvantages. Proper dopant drop is difficult to achieve consistently. Problems such as splashing and evaporation are not uncommon. Furthermore, this method requires the pull chamber be opened and evacuated twice. Such extra steps slow the crystal-growing operation and allow the dopant concentration to change through evaporation. Such steps are also labor intensive and increase the risk of a vacuum leak, which can contaminate the melt. The dopant delivery device can also bring contamination into the furnace. Another disadvantage is that the dopant delivery device is expensive and subject to wear or breakage.

Japanese patent application J 62-153188, assigned to Mitsubishi Metal KK, describes doping a semiconductor melt by attaching a dopant to a seed crystal and then dipping the seed and dopant into the melt. Dipping the seed into the melt, without appropriate pre heating causes thermal stress within the seed which can result in cracks or structural defects. Pre-heating of the seed may cause premature dopant drop causing a melt splash.

The Mitsubishi patent describes two methods for attaching the dopant to the seed. One method requires boring a transverse hole into the seed crystal near its unchucked end, melting the dopant, and solidifying the dopant around the seed and in the hole. Machining the seed, such as by boring a hole, requires additional process steps. The second attachment method uses a ring of dopant that is placed over the seed and kept from dropping off by a block of silicon laser-welded to the bottom of the seed. The laser-welded block of silicon separates from the seed after the block, seed, and dopant are dipped into the melt. This attachment or supporting method is complex and requires additional process steps and equipments.

Japanese patent application J 60-171291, assigned to Furukawa Electric Company, describes a dopant in the form of a thin electrical current-carrying wire attached to a seed crystal. The seed contacts the molten semiconductor, causing the dopant wire to melt and thereby interrupt the current flow. The interrupted current flow automatically causes a computer to begin the crystal-pulling procedure. The disadvantages of contacting the seed to the molten semiconductor are described above. This method also requires forming the dopant into a wire and attaching electrodes to the dopant within the high temperature crystal-growing environment.

SUMMARY OF THE INVENTION

An object of the present invention is, therefore, to provide a method for doping a semiconductor melt with a dopant having a high vapor pressure.

Another object of this invention is to provide such a method that results in a melt having an accurately predetermined dopant concentration.

A further object of this invention is to provide such a method that does not cause damage to a seed crystal.

Yet another object of this invention is to provide a doping method that is a simple, inexpensive, and time efficient process step.

The present invention includes a method of doping a semiconductor melt, a seed-dopant assembly that allows the melt to be easily doped, and a method of attaching a dopant to a semiconductor seed. The invention is particularly useful for dopants having a high vapor pressure and a melting temperature significantly lower than that of the semiconductor material being doped. According to the present invention, a dopant having a lower melting temperature than that of a seed crystal, or "seed," is melted around the seed and solidified to form a seed-dopant assembly. The dopant adheres to the surface of the seed as it cools and solidifies. Therefore, the seed can be unmodified, i.e., it need not be machined or welded to form any Special supporting structure to mechanically hold the dopant.

When the seed-dopant assembly is lowered and held just above the melt in a crystal-growing furnace, heat from the melt heats the seed and the dopant, allowing the dopant to slip off. Because the seed is not machined to form any special supporting structure, the dopant is free to slip off the seed and fall into the melt. Thus, dipping the seed and dopant into the melt is unnecessary, and the possibility of damaging the seed is reduced. Because a substantial amount of the dopant material is in a solid phase upon entering the melt, evaporation loss is minimal. This method, therefore, minimizes the amount of time that hot solid or molten dopant is exposed to the furnace atmosphere, thereby reducing the amount of dopant lost by evaporation. Reducing the evaporation loss reduces the amount of dopant required and improves the ability to produce crystals having a desired concentration of dopant.

To cast the dopant onto the seed, the seed is placed with a measured amount of dopant, typically in pellet form, in a reusable quartz crucible or other high purity material having a flat bottom and sides tapering outwardly away from the bottom. The crucible is placed in a casting fixture, with the seed loosely held upright by a seed retention ring. The casting fixture is placed in an inert atmosphere, high purity furnace or oven, such as the hot zone of a crystal-growing furnace, and the temperature is raised until the dopant melts around the seed. The dopant then cools and solidifies around the seed. The seed and attached dopant are easily removed from the crucible. The seed is typically heavier than the dopant and will generally maintain contact with the bottom of the crucible during the casting process, thereby ensuring that the seed is sufficiently close to the melt to absorb heat during the doping operation.

To grow the doped single-crystal ingot, a crucible is packed with a charge of polycrystalline material and placed in the hot zone of a conventional crystal-growing furnace. The seed having the cast dopant attached is placed in a seed chuck and suspended from the seed cable in the coolest part of the furnace, i.e., the top of the pull chamber. The furnace is evacuated and checked for vacuum integrity, and the semiconductor charge is melted. The seed is then lowered to about one cm above the melt and held in that position until the dopant slips off the seed crystal. The dopant is sufficiently close to the melt so the dopant does not cause a splash as it drops into the melt. After the dopant has had sufficient time to mix uniformly throughout the melt, the seed is lowered into the melt, and a semiconductor ingot is grown in a conventional manner.

Because the dopant is cast onto the seed crystal, it is not necessary to open and reseal the crystal-growing furnace to insert and remove a dopant delivery device. This significantly reduces the total time required to grow an ingot and also reduces the possibility of contamination caused by vacuum leaks. Furthermore, because the dopant is close to the melt when it drops off the seed, there is no splashing. The dopant is incorporated into the melt with less evaporation loss; therefore, less dopant is required and the concentration of dopant in the melt can be determined with higher accuracy.

Additional objects and advantages of the present invention will be apparent from the following detailed description of preferred embodiments thereof, which proceeds with reference to the accompanying drawings.

DETAILED DESCRIPTION OF PREFERRED EMBODIMENTS

Figure 1:
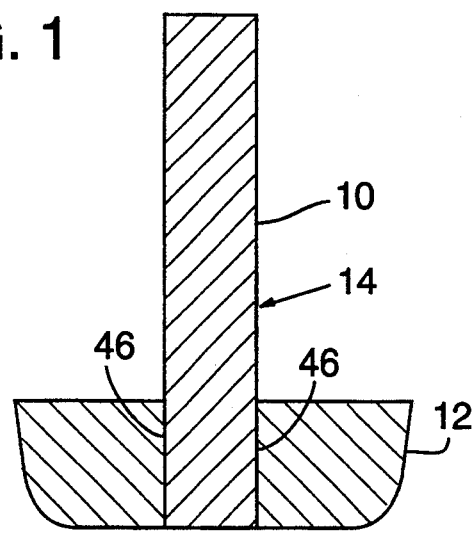
FIG. 1 is a cross-sectional view of a seed crystal having a dopant attached to form a seed-dopant assembly.
Figure 2:
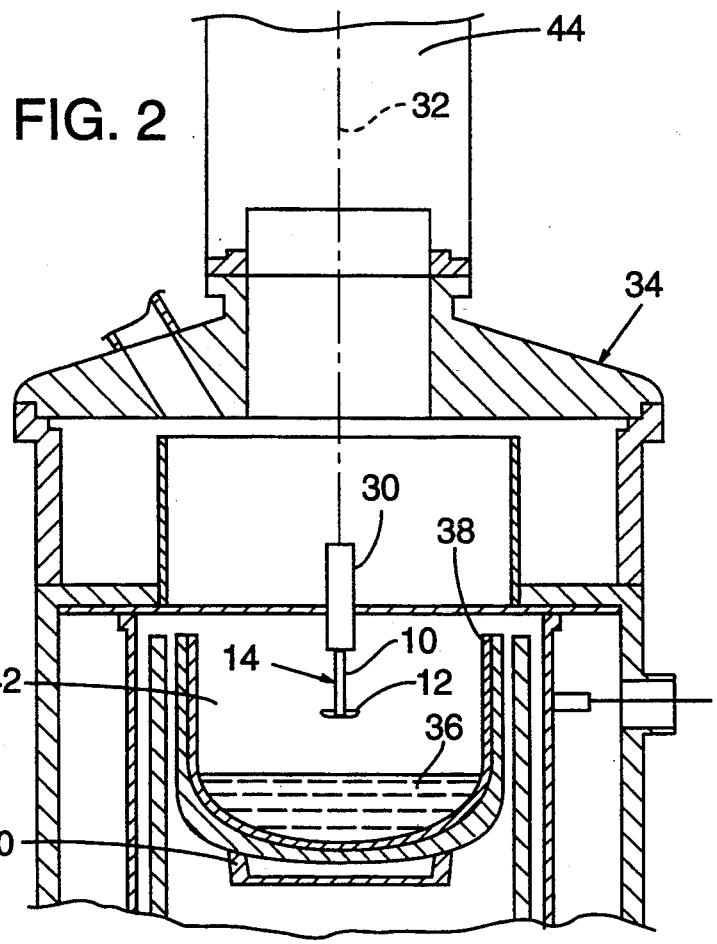
FIG. 2 is a diagram showing the seed-dopant assembly of FIG. 1 positioned within the furnace tank of a crystal-growing furnace.

FIG. 1 shows a seed crystal 10 and an attached cast dopant 12 forming a seed-dopant assembly 14 according to the method of the present invention. FIG. 2 shows seed-dopant assembly 14 suspended from a seed chuck 30 attached to a seed cable 32 within a crystal-growing furnace 34. A melt 36 of molten semiconductor material is contained within a crystal-growing crucible 38 positioned on a crucible stand 40 in a hot zone 42 of furnace 34. As seed cable 32 is lowered from a pull chamber 44 and seed-dopant assembly 14 approaches to within about one cm of melt 36, heat from melt 36 begins to heat seed and cast dopant 1246, and dopant 12 falls into melt 36 without splashing.

In a preferred embodiment, melt 36 comprises molten high purity silicon; crystal-growing furnace 34 is of the Czochralski type; and cast dopant 12 comprises antimony. Antimony has a melting temperature of approximately 630° C. Tin, having a melting point of 230° C., is another material particularly suited to be used as dopant 12.

Figure 3:
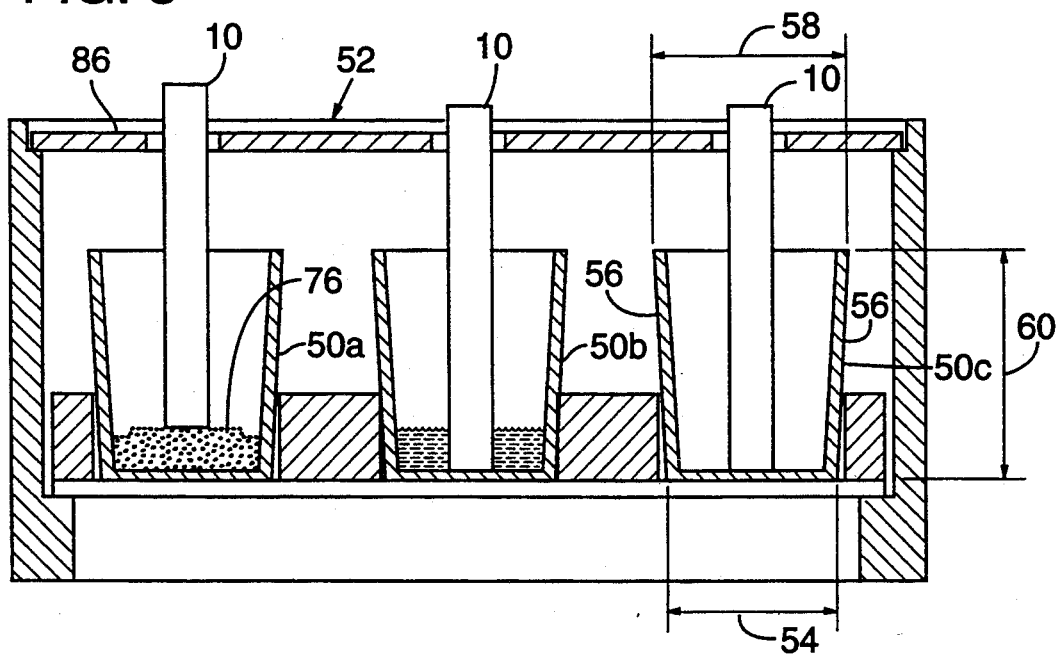
FIG. 3 is a cross-sectional view of a casting fixture holding casting crucibles for casting the dopant onto the seed crystal to form the seed-dopant assembly of FIG. 1.

FIG. 3 shows three casting crucibles 50a, 50b, and 50c (collectively "crucibles 50") illustrating various aspects of the casting process explained below. Obviously, several crucibles could be used to simultaneously cast dopant 12 onto several seeds 10. During the casting process, crucibles 50 are contained within a casting fixture 52, made of quartz or other suitable material. Casting crucible 50 is preferably a high purity, tapered-wall crucible made of quartz or other suitable material. Dimensions of preferred crucibles 50 are illustrated one crucible 50c for convenience. Casting crucibles 50 have a bottom diameter 54 of approximately 3 cm (1.2 in) and walls 56 tapering outwardly away from the bottom at a taper angle of approximately 13 degrees to a top diameter 58. Casting crucibles 50 have a height 60 of between approximately 2.5 cm to 5.0 cm (1.0 in to 2.0 in). The dimensions of casting crucible 50 are not critical. Preferred dimensions for bottom diameter 54, top diameter 58, and height 60 may vary depending upon the amount of dopant required.

The first step in casting the dopant entails cleaning quartz crucible 50 using, for example, isopropyl alcohol. Next, one or more casting crucibles 50 are placed in casting fixture 52, and a measured amount of a dopant 76 is added to casting crucible 50. Dopant 76 is preferably antimony in a conventional form, such as pellets of between one and three millimeters in diameter. Dopant 76 could be added before a seed retention ring 86 is set onto casting crucible 50c to loosely maintain seed 10 in an approximately vertical orientation. Dopant 76 is melted by being heated in, for example, a crystal growing furnace. The magnitude and duration of the power applied to the furnace depends on the amount of dopant 76 being cast. Adequate power is applied to ensure dopant 76 is sufficiently molten to adhere to seed 10. Dopant 76 will adhere to seed 10 even if dopant 76 is not uniformly melted, although dopant 76 is typically uniformly melted during the casting process. Seed 10, if of sufficient length, will sink in molten dopant 76 until it rests on the bottom of casting crucible 50b, thereby promoting heat transfer from melt 36 to seed 10 during the doping process described below.

Some molten dopants 76, such as antimony and tin, tend to wet the surface of seed 10, causing dopant 76 to adhere to seed 10 upon freezing. Some dopants 76, such as antimony and tin, have thermal coefficients of expansion greater than that of silicon. Such dopants 76 tend to contract more than seed 10 contracts during cooling, causing dopant 76 to grip seed 10. Solidified cast dopant 12, therefore, does not require a special supporting structure, such as a hole, a notch, or retainer, to attach to seed 10. After cooling, seed-dopant assembly 14 is removed from crucible 50 and stored in a clean protected container.

The time period during which dopant 76 is at an elevated temperature should be minimized to avoid loss of dopant 76 through evaporation.

Figure 4:
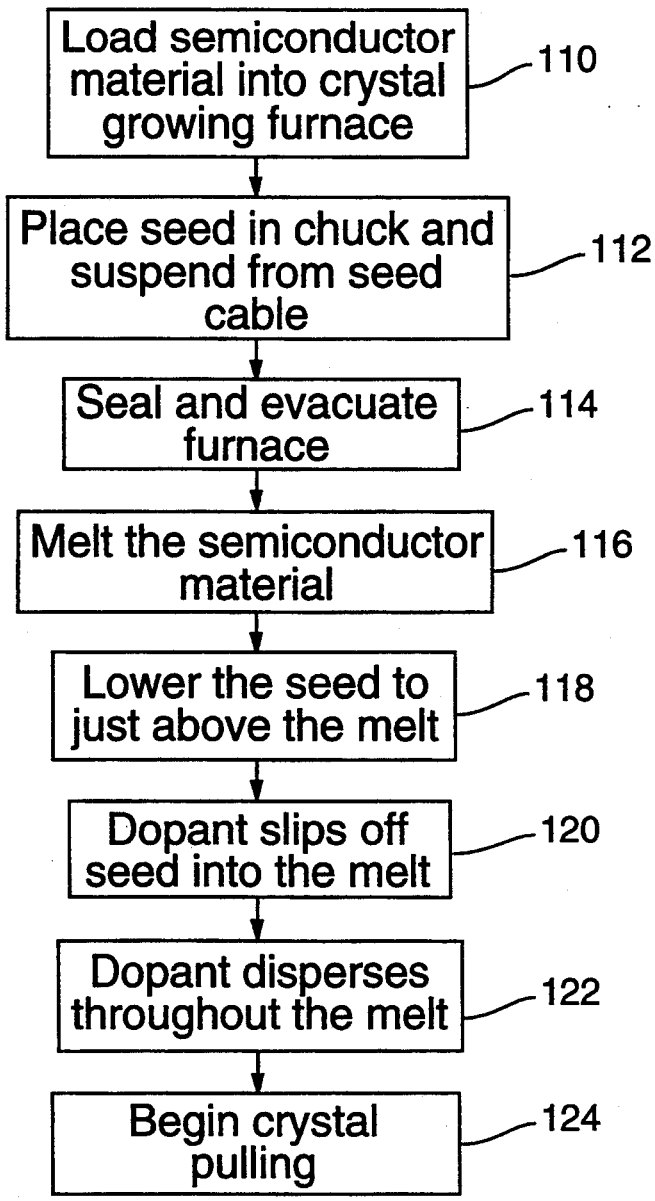
FIG. 4 is a flow chart showing process steps for doping a melt using the seed-dopant assembly of FIG. 1.

FIG. 4 is a flow chart showing the steps for doping melt 36 using seed-dopant assembly 14. With reference to FIGS. 2 and 5, process step 110 indicates that the furnace is loaded with the semiconductor material to be grown, preferably high purity polycrystalline silicon. Process step 112 indicates that seed-dopant assembly 14 is placed in chuck 30, which is suspended from seed cable 32. Process step 114 indicates that furnace 34 is sealed and evacuated normally, and process step 116 indicates the polycrystalline semiconductor is melted. During process step 114, seed-dopant assembly 14 is kept high up in pull chamber 44, well away from the hot zone 42, to maintain the dopant in solid form.

Process step 118 indicates that seed-dopant assembly 14 is lowered on seed cable 32 to approximately one cm above melt 36. Within a few seconds, heat is transferred from the melt to dopant 12 and seed 10. Process step 120 indicates that heat transferred to seed 10 and dopant 12 causes dopant 12 to slip off seed 10 shortly after seed-dopant assembly 14 is brought near melt 36. A substantial amount, typically a preponderance, of dopant 12 is in a solid phase when it slips from seed 10, thereby decreasing the time during which the dopant is exposed to an elevated temperature in the furnace atmosphere and, therefore, reducing dopant loss through evaporation. Because of the short distance between dopant 12 and melt 36 when dopant 12 drops, there is no splash as it enters melt 36. After sufficient uniform mixing crystal growing proceeds in a conventional manner.

It will be obvious that many changes may be made to the above-described details of the invention without departing from the underlying principles thereof. For example, although doping of a silicon melt by antimony in a Czochralski-growing process is described, the invention is applicable to other semiconductors, dopants, and growing methods. The scope of the present invention should, therefore, be determined only by the following claims.

We claim:

1. A method of doping molten semiconductor in a crystal-growing furnace, comprising:
    casting a dopant onto a seed crystal;
    suspending the seed crystal above the molten semiconductor;
    dropping the dopant into the molten semiconductor from a position above the molten semiconductor.

2. The method of claim 1 in which casting a dopant onto a seed crystal includes casting the dopant onto a seed crystal without a special supporting structure.

3. The method of claim 1 in which a substantial amount of the dopant is solid when it drops from the seed crystal.

4. The method of claim 1 in which the dopant comprises antimony.

5. The method of claim 1 in which the dopant comprises tin.

6. The method of claim 1 in which the molten semiconductor comprises silicon.

7. The method of claim 1 in which casting a dopant onto a seed crystal is performed in a high purity, inert environment.

8. The method of claim 7 in which casting a dopant onto a seed crystal is performed in a high purity tapered crucible.

9. A semiconductor seed-dopant assembly, comprising:
    a semiconductor seed crystal; and
    a dopant cast around an end of the semiconductor seed crystal and adhered thereto by at least one of a surface adhesion and a grip caused by a thermal coefficient of expansion difference between the seed crystal and the dopant, such that a substantial amount of the dopant slips off in a solid phase from the seed crystal when the dopant and the seed crystal are heated to a temperature in a range between a melting temperature of the dopant and less than a melting temperature of the semiconductor seed.

10. The seed-dopant assembly of claim 9 in which the seed crystal comprises silicon.

11. The seed-dopant assembly of claim 9 in which the dopant comprises antimony.

12. The seed-dopant assembly of claim 9 in which the seed crystal comprises silicon and the dopant comprises antimony.

13. A method of attaching a dopant to a semiconductor seed crystal, comprising:
    providing a container suitable for holding a molten dopant;
    placing the dopant in the container;
    placing an end of the seed crystal in the container with the dopant;
    melting the dopant but not the seed crystal;
    cooling and solidifying the dopant so that the dopant adheres around the end of the seed crystal by at least one of a surface adhesion and a grip caused by a thermal coefficient of expansion difference between the seed crystal and the doping; and
    removing the seed crystal and attached dopant from the container,
    whereby a substantial amount of the dopant slips off in a solid phase from the seed crystal when the dopant and the seed crystal are heated to a temperature in a range between a melting temperature of the dopant and less than a melting temperature of the semiconductor seed.

14. The method of claim 13 in which the dopant comprises antimony.

15. The method of claim 13 in which the seed crystal comprises silicon.

16. The method of claim 13 in which melting the dopant is performed in a high purity, inert environment.

17. The method of claim 13 in which the container is a high purity crucible having tapered walls.

18. The method of claim the 1 in which the position is about one centimeter above the molten semiconductor.

* * * * *

UNITED STATES PATENT AND TRADEMARK OFFICE
CERTIFICATE OF CORRECTION

PATENT NO. : 5,406,905
DATED : April 18, 1995
INVENTOR(S) : Mengistu Yemane-Berhane and Bruce L. Colburn It is certified that error appears in the above-indentified patent and that said Letters Patent is hereby corrected as shown below:

ON THE TITLE PAGE:

Assignee, change "Simco/Ramic Corporation, Medford, Oreg." to --SEH America, Inc., Vancouver, Wash.--

Column 2, line 55, change "Special" to --special--.

Column 4, line 19, change "Czochralskitype" to --Czochralski type--

Column 4, line 36, change "Walls" to --walls--.

Column 4, line 58, change "molter" to --molten--.

Column 6, line 46, change "doping" to --dopant--.

Signed and Sealed this

Twenty-fifth Day of July, 1995

Attest:

BRUCE LEHMAN

Attesting Officer        Commissioner of Patents and Trademarks